United States Patent [19]

Bullock

[11] 4,140,936
[45] Feb. 20, 1979

[54] SQUARE AND RECTANGULAR ELECTROACOUSTIC BENDER BAR TRANSDUCER

[75] Inventor: John D. Bullock, State College, Pa.

[73] Assignee: The United States of America as represented by the Secretary of the Navy, Washington, D.C.

[21] Appl. No.: 829,700

[22] Filed: Sep. 1, 1977

[51] Int. Cl.² .............................................. H01L 41/10
[52] U.S. Cl. ..................................... 310/328; 310/331; 310/363
[58] Field of Search ................................ 310/330–332, 310/328, 334

[56] References Cited

U.S. PATENT DOCUMENTS

| 2,769,867 | 11/1956 | Crownover et al. | 310/331 X |
| 3,127,527 | 3/1964 | Elston et al. | 310/331 |
| 3,360,664 | 12/1967 | Straube | 310/330 |
| 3,370,187 | 2/1968 | Straube | 310/331 X |

Primary Examiner—Mark O. Budd
Attorney, Agent, or Firm—Richard S. Sciascia; Paul N. Critchlow

[57] ABSTRACT

The transducer's active elements are a plurality of thin, narrow, piezoelectric bars bonded side-by-side to a flexible plate. Electrically, a circuit is coupled across the thickness of each bar or strip to include the bars as a plurality of parallel capacitors. The plate has a fixed length that is maintained during operation. Consequently, piezoelectric length expansions and contractions of the bars are translated into an oscillating bending motion of the bars and the plate for transducing purposes.

2 Claims, 9 Drawing Figures

SQUARE AND RECTANGULAR ELECTROACOUSTIC BENDER BAR TRANSDUCER

BACKGROUND OF THE INVENTION

The present invention relates to electroacoustic transducer and, in particular, to transducers of the type utilizing piezoelectric bender members as active transducer elements.

Bender-type piezoelectric or piezoceramic transducers are rather well known and have been used to advantage in a variety of forms. One such type is provided by the use of a circular, piezoelectric disc that is securely bonded to a circular metal plate so as to vibrate in an umbrella-like mode when mechanically or electrically energized. Such discs, however, have limited power capabilities. Also, because they are disc-shaped, a maximum packing density is not easily achieved. Compared with square or rectangular configurations having sides equal to the disc diameter, considerably less exposed surface area is formed of piezoelectrically active material.

Another type of bender transducer utilizes a square or rectangular piezoelectrical bender in the form of a single, solid plate. Such a geometry clearly is more favorable, but the use of the single plate still results in the umbrella-like vibratory motion of the disc configuration. Since the piezoelectric coupling is in all directions, all edges move and, to produce the umbrella motion, they require support at their corners. The need for this support presents significant constructional difficulties and further reduces the strength of the transducer element when subjected to pressure loads across its surface.

The present invention has as one of its objects the provision of a bender transducer which is capable of utilizing the square or rectangular bender configuration to facilitate construction and provide greater structural strength.

Another important object is to provide a transducer element structure that results in relatively higher electroacoustical efficiencies due, particularly, to the nature of its piezoelectric coupling.

In a manner to be described, the objects of the invention are achieved by using elongate, thin and narrow, piezoelectric bars or strips. The strips extend lengthwise of a flexible support plate to which they are securely bonded in a tightly-compacted side-by-side arrangement. The plate itself is rigidly engaged and supported at its longitudinal ends. Consequently, forces tending to cause the piezoelectric bars to lengthen or shorten result in a bending or flexing of the bars and, of course, the end-restricted plate to which the bars are bonded. To energize the bars and transduce electroacoustical signals, a circuit is coupled across each bar so that, in effect, the bars become a plurality of parallel capacitors. In a preferred form, the strips or bars are bonded to both sides of the plate although a single sided arrangement is operable. To improve flexibility, the plate itself can be hinged in a manner which will be described.

BRIEF DESCRIPTION OF THE DRAWINGS

The present invention is illustrated in the accompanying drawings of which.

DETAILED DESCRIPTION OF THE INVENTION

Figure 5:
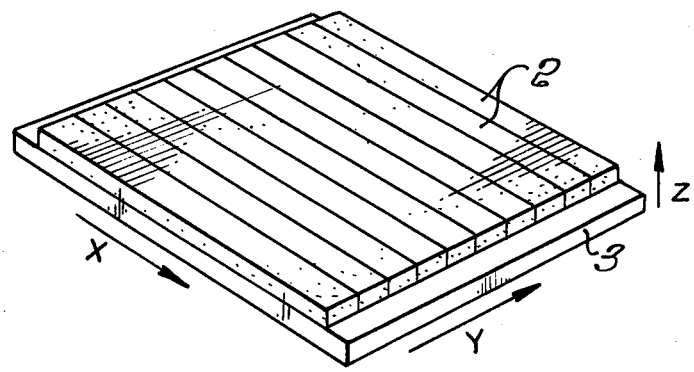
FIG. 5 is a view in perspective illustrating a modified form of the bender bar construction of the transducing element.
Figure 6:
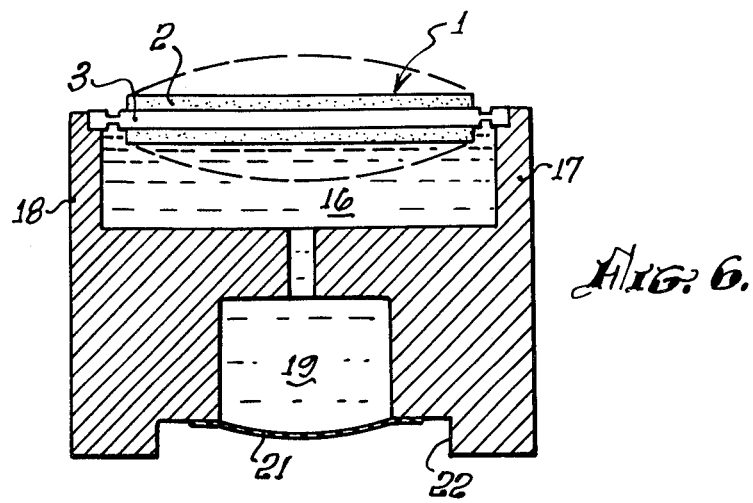
FIG. 6 is a schematic view showing in section one manner in which the transducing element can be employed in a transducer assembly.

The present description primarily will be with reference to a particular transducing element or, in other words, to the element which provides the active or piezoelectrically-responsive component of the transducer assembly in which it is mounted. This element is identified generally by numeral 1, FIGS. 1–5. FIG. 6, in turn, illustrates the manner in which element 1 is incorporated into a transducer assembly. Although this particular assembly is clearly advantageous, other arrangments, of course, are contemplated.

Transducer element 1 generally includes a plurality of thin, narrow piezoelectric or piezoceramic strips or bars 2 bonded to a flexible metal support plate 3 formed, for example, of aluminum, brass or steel. At its end the plate is engaged by rigid walls 4 and 6. The wall, in addition to providing support, also functions to rigidly maintain the fixed length of the plate or, in other words, to prevent the plate from expanding or stretching lengthwise. Instead, tendencies to stretch are translated into a bending mode as indicated by the dotted lines in FIG. 1. To facilitate the flexing or bending motion, the end portions of the plate are reduced in thickness to form, in effect, hinges 7 and 8.

Figure 1:
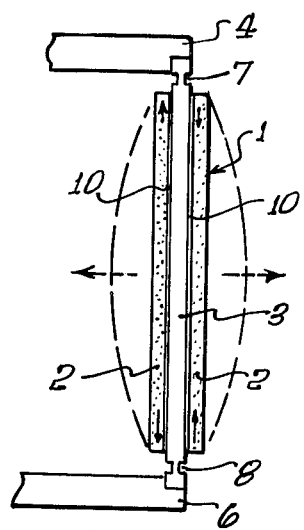
FIG. 1 is a somewhat schematic side view of one form of the transducing element of the present bender bar transducer.
Figure 2:
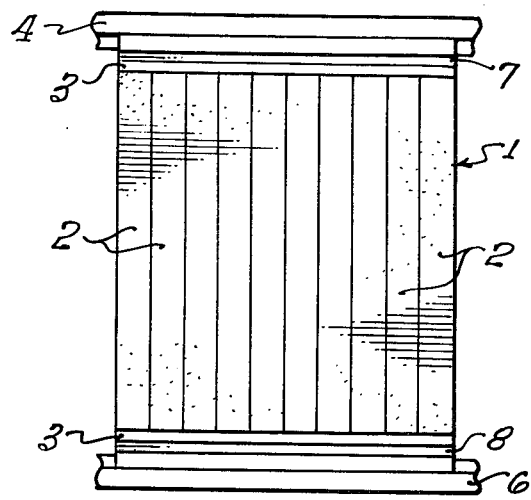
FIG. 2 is a face view of the transducer element of FIG. 1.

The arrangement of bars 2 on the support is shown in FIG. 2. As noted, they are disposed in side-by-side disposition extending substantially the width of the plate. Most suitably, the bars are square or rectangular in cross section to provide flat surfaces for providing a tightly-compacted, side wall engagement. In the dotted line bending mode shown in FIG. 1, the bars and the plate on which they are mounted bend or flex as a unit. For this purpose, bars 2 may be securely bonded to the plate by an appropriate epoxy layer 10 or by other suitable means, and for electrical purposes, the epoxy may be a conductive material. However, as will be described, the requisite conductivity can be provided in other manners. It also is to be noted that the bar arrangements can be provided either on one or both sides of the plate. A double-side bender is shown in FIG. 1 while FIG. 5 shows a single-side arrangement. Functionally, a double-side arrangement increases the binding or flexing action although the single side is fully capable of operating as a transducer element.

Figure 3:
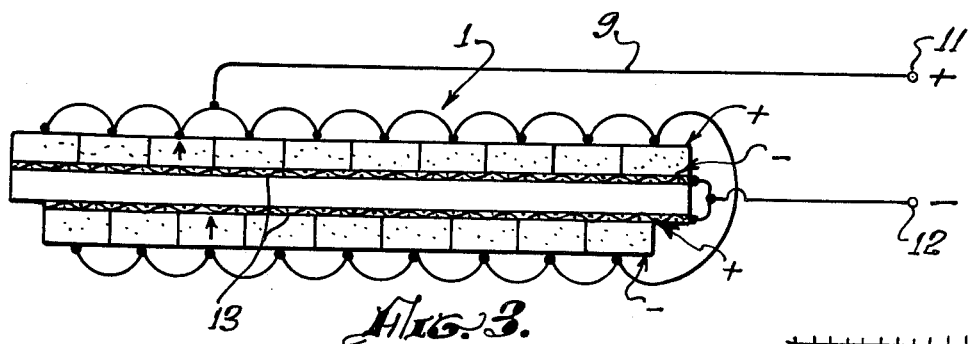
FIG. 3 is an end view of the element showing in particular the manner in which the bender bars are electrically connected to input or output terminals.
Figure 4:
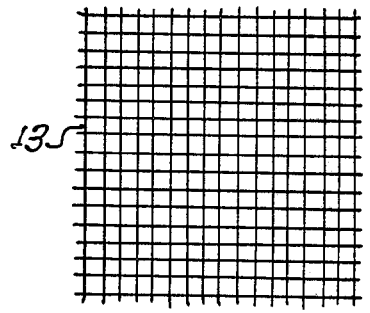
FIG. 4 is a face or plan view of a wire screen device used for the electrical coupling.

FIG 3. illustrates the electrical connections for transducer element 1 or, more specifically, for piezoelectric bars 2. As shown, the circuit utilizes a single wire 9 for coupling each bar to input and output terminals 11 and 12. Input terminal 11 is coupled to the outer surface of each of the bars and terminal 12 is coupled to the inner or plate-engaging surface of the bars, a conductive wire screen member 13 can, if desired, be sandwiched in the epoxy bond between the bars and the plate. Such a screen avoids the need for a conductive bonding material and is preferred in most arrangments. Another coupling technique is simply to roughen the surface of the central support plate 3. If the piezoelectric bars then are clamped sufficiently during assembly, the roughened surface will contact the bars at various points intermixed with glue contact.

Wire 9 is soldered in the usual manner to each of the bars so that, in effect, electrodes are provided across the bar thickness and the bars thus become a series of parallel capacitors. With such an electrical connection, the polarization of the ceramic or piezoelectric material is as shown in FIG. 3. More particularly, the connection is such that the polarization of the bars on opposite sides of plate 3 is mutually opposite. Another feature apparent in FIG. 3 is the fact that the bar arrangement on one side of the plate is staggered relative to the bar arrangement on the other. In other words, the bars are alternately spaced from top to bottom for the purpose for suppressing the vibration modes of the plate with nodal lines parallel to the -X- axis i.e. lateral modes of vibration are suppressed.

The use of the thin, elongate strips of piezoelectric material is to permit the utilization of the $g_{31}{}^l$ coupling and to suppress the $g_{31}{}^w$ coupling. Although obviously both couplings are present, $g_{31}{}^w$ is not dominant for $l >> w$ and $l >> t$. When such bars are separated from the plate or, in other words, when their ends are not fixedly supported, they function as thin, length-extenders. Obviously, the length extension also is maintained when they are coupled or bonded to plate 3. As a result, when an AC signal is applied to the bars, the resulting movement is as shown in the dotted line bending mode of FIG. 1. More specifically, the length extension property of the bar results in a thickness descrease or increase (Poisson's ratio) tending to pull the plate apart in the X direction (FIG. 5). Since the plate is supported at its ends, it will bend parallel to the X axis in the Z direction. The application of the AC signal to the top bars (FIG. 3) tends, for example, to increase the length and decrease the thickness while, with the application of the same AC signal, the connection to the bottom bar produces a shortening which increases the desired bending action. The same bending motion occurs with the single-side FIG. 5 arrangement although it may not be quite as pronouced. In other words, the use of piezoelectric bars on both sides of the plate is not essential to operation since a single-side arrangement also functions as a transducer. In the illustrated forms of the transducing element it will be noted that the fixed support for plate 3 is provided only at its longitudinal ends.

FIG. 6 demonstrates the bender plate assembled as a transducer element. As shown, the transducer has a bender element body member 14 formed at its upper end into a cavity 16 by upwardly-extending walls 17 and 18. Transducing element 1, in turn, is mounted at the upper or outer end of cavity 16 and walls 17 and 18 provide the desired rigid support for plate 3. Also, the cavity preferably is a complaint member filled with a suitable fluid which, as shown, is in communication with an expansion, fluid-filled cavity 19. A rubber diaphragm 21 separates cavity 19 from a fluid reservoir 22 which may simply be the ambient pressure of the fluid media. In some situations, it may be desirable to eliminate the rubber diaphragm and have the fluid common to one large reservoir. Functionally, compliant cavity 16 provides a termination for the backside of the bender as well as a means of stopping the radiation from this face and hence suppressing a dipole response pattern. It also is desirable to seal the moving edges of the support plate with an appropriate elastic adhesive to operate as a monopole source. The adhesive may be a room temperature vulcanizing compound selected for its compatability with the fluid used for pressure relief in cavity 16. In some situations a dipole response may be desirable in which case no compliant cavity becomes a valid transducer configuration. In general, the sound radiated from the front face is that due to a square piston with some average velocity equivalent to the average velocity of a square or rectangular member moving in its first mode. Expansion cavity 19 also be included for temperature pressure effects on the field.

Figure 7:
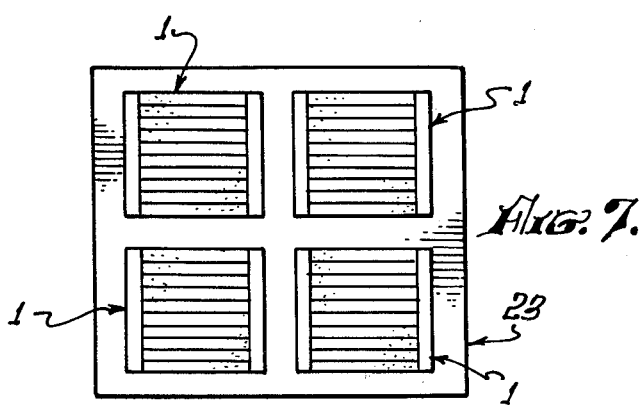
FIGS. 7 and 8 are face and end views of a bender block arrangement employing four individual transducing elements.
Figure 8:
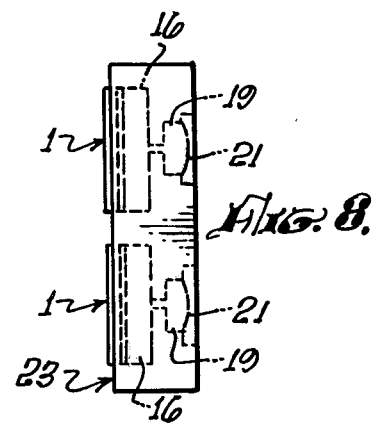
Figure 9:
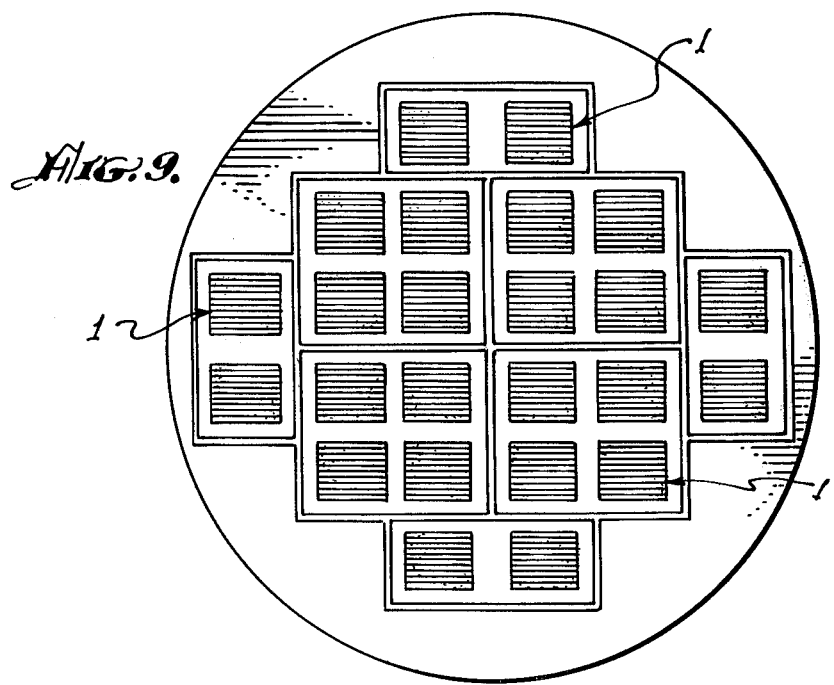
FIG. 9 is a planar bender arrangement including the four element blocks of FIGS. 7 and 8 as well as other two element blocks.

FIGS. 7, 8 and 9 illustrate some of the advantages achievable by the use of the present square or rectangular bender element. Thus, as seen best in FIG. 7, the transducing element itself may be formed as a four element square bender with the bender elements 1 disposed side-by-side to form block 23. In this configuration, the boundary or end support of the plate of each of the elements is provided by appropriate walls of the transducer assembly body portion. Such a square or rectangular shape also lends itself to the fabrication of the group arrays which, as shown in FIG. 9, may include such configurations as two or three elements in line or four in a square. The resulting array composed of such groups of modules advantageously consolidates inner connections and makes pressure relief, such as that provided by the fluid reservoir, easier to construct and utilize. In particular, the square or rectangular configuration results in a higher power handling ability due to an increase in the active material volume. In comparison to a circular configuration, it utilized more of the surface area of the array for active piezoelectric material. The motion in such an array is more like that of a square or rectangular piston and is closer to the radiation characteristics of rigid pistons used in current Tonpilz transducer elements than that of a circular umbrella-type bender disc. The rectangular configuration also should result in higher efficiencies due to the piezo coupling which is involved. In other words, the electrical to acoustical or vice versa conversion efficiency is improved.

The operation of the transducer as well as its particular advantages should be readily apparent from the foregoing description. Obviously many modifications and variations of the present invention are possible in the light of the above teachings. It is therefore to be understood that within the scope of the appended claims the invention may be practiced otherwise than as specifically described.

I claim:

1. An electromechanical bender bar transducing element comprising:
   a rectilinear flexible support plate member having a fixed length and flat top and bottom surfaces,
   rigidly fixed means restrictably engaging said plate member for maintaining its fixed length,
   a plurality of flat-walled elongate and flexibly-thin piezoelectric bar members securely boned to both said top and bottom surfaces of said flexible plate, said elongate member being uniformly rectalinear in cross-section and being disposed on each of said surfaces in a side-by-side closely-compacted arrangement with the longitudinal axes of the members secured to one of said surfaces being staggered relative to the longitudinal axes of those secured to the other surface for suppressing undesired vibration modes, electrically-conductive circuit means coupled across each bar member in a manner capable of establishing parallel bar member capacitors of mutually opposite polarity on said top and bottom plate surfaces, whereby electrical forces applied to said bar members produce length variations restrainably converted into bending motions for transducing purposes and, conversely, mechanically-applied bending forces transducably produce electrical response in said circuit means.

2. The transducer element of claim 1 wherein said electrically-conductive circuit means is coupled across the thickness of each of said bar members, said circuit means including an electrically-conductive screen mean co-extensively sandwiched between said pluralities of bar member and the surfaces of said support plate member to which the bar members are bonded.

* * * * *